(12) United States Patent
Nakasato et al.

(10) Patent No.: US 7,777,864 B2
(45) Date of Patent: Aug. 17, 2010

(54) DEVICE AND METHOD FOR CONTROLLING CLOSE CONTACT OF NEAR-FIELD EXPOSURE MASK, AND NEAR-FIELD EXPOSURE MASK FOR THE SAME

(75) Inventors: Shinji Nakasato, Isehara (JP); Yasuhisa Inao, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 1414 days.

(21) Appl. No.: 11/195,635

(22) Filed: Aug. 3, 2005

(65) Prior Publication Data

US 2006/0029867 A1    Feb. 9, 2006

(30) Foreign Application Priority Data

Aug. 4, 2004    (JP) .............................. 2004-227538

(51) Int. Cl.
*G03B 27/62*    (2006.01)
(52) U.S. Cl. ............................. 355/76; 430/5
(58) Field of Classification Search ...... 430/5, 430/22, 311; 355/75, 76; 356/237.1
See application file for complete search history.

(56) References Cited

U.S. PATENT DOCUMENTS

| | | | |
|---|---|---|---|
| 6,171,730 B1 | 1/2001 | Kuroda et al. ................. 430/5 |
| 6,628,392 B2 | 9/2003 | Kuroda et al. ................. 356/400 |
| 6,720,115 B2 | 4/2004 | Inao et al. ........................ 430/5 |
| 7,001,696 B2 | 2/2006 | Inao et al. ........................ 430/5 |
| 7,315,354 B2 * | 1/2008 | Mizutani ........................ 355/76 |
| 2004/0121245 A1 | 6/2004 | Inao et al. ........................ 430/5 |
| 2004/0166421 A1 * | 8/2004 | Yamaguchi et al. ............. 430/5 |
| 2005/0057752 A1 | 3/2005 | Inao et al. ..................... 356/400 |
| 2005/0062947 A1 * | 3/2005 | Fuse ............................ 355/30 |
| 2005/0064301 A1 | 3/2005 | Yamaguchi et al. ............. 430/5 |
| 2006/0003233 A1 | 1/2006 | Yamaguchi et al. ............. 430/5 |
| 2006/0003236 A1 | 1/2006 | Mizutani et al. ................. 430/5 |
| 2006/0007440 A1 | 1/2006 | Kuroda et al. ................. 356/400 |

* cited by examiner

*Primary Examiner*—Mark F Huff
*Assistant Examiner*—Stewart A Fraser
(74) *Attorney, Agent, or Firm*—Fitzpatrick, Cella, Harper & Scinto

(57) ABSTRACT

A near-field exposure apparatus for exposing a substrate to light via an exposure mask under a condition that the exposure mask is close to the substrate. The apparatus includes a pressure adjustable container to control a relative position of the exposure mask to the substrate by adjusting a pressure of the pressure adjustable container. The pressure adjustable container has a structure adapted to be tightly closed with the exposure mask being held mounted so as to prevent volatile substances or foreign substances from entering into the pressure adjustable container. The pressure of the pressure adjustable container is adjustable through a change in capacity of the pressure adjustable container.

10 Claims, 5 Drawing Sheets

DEVICE AND METHOD FOR CONTROLLING CLOSE CONTACT OF NEAR-FIELD EXPOSURE MASK, AND NEAR-FIELD EXPOSURE MASK FOR THE SAME

This application claims priority from Japanese Patent Application No. 2004-227538, filed on Aug. 4, 2004, which is hereby incorporated by reference.

FIELD OF THE INVENTION AND RELATED ART

This invention relates to a device and a method for controlling close contact of a near-field exposure mask, and a near-field exposure mask for the same.

Because of rapid increases in the capacity of semiconductor memories, and in the speed and density of CPU processors, further advancement of fineness in optical lithography has been necessitated. Generally, the limit of microprocessing in an optical lithographic apparatus is about the wavelength of the light that is used. For this reason, the wavelength of light used in optical lithographic apparatuses has been shortened and, currently, near ultraviolet radiation lasers are being used, to enable microprocessing of about 0.1 μm order.

Although the fineness of microprocessing is being advanced as such, there still remain many problems to be solved to enable microprocessing under a 0.1 μm order, such as further shortening of the wavelength of lasers or the development of lenses to be used in these wavelength regions.

On the other hand, as a system for enabling microprocessing under 0.1 μm, on the basis of the light being used, microprocessing apparatuses using a structure of a near-field optical microscope (hereinafter, "SNOM") have been proposed. These are an apparatus wherein, by the use of a near field leaking from small openings of a size under 100 nm, for example, local exposure of a resist that exceeds the limit of the wavelength of the light is carried out.

With the lithographic apparatuses having an SNOM structure, however, the microprocessing is carried out by use of a single probe or plural probes, as in a "single stroke drawing". Therefore, the throughput is disadvantageously slow.

This inconvenience may be solved by implementing the method disclosed in U.S. Pat. No. 6,171,730, wherein a photomask having a pattern that is designed to produce near-field light leaking from a light-blocking film is closely contacted to a photoresist applied on a substrate and wherein, by performing exposure, the fine pattern of the photomask is transferred to the photoresist at one time. The method and apparatus disclosed in the aforementioned U.S. patent are really very useful, and contribute largely to the state of the art.

However, there still remains an inconvenience to be overcome. FIG. 5 of the attached drawings illustrates an example of an apparatus of the type disclosed in the aforementioned U.S. patent. That is, in FIG. 5, a cylinder 1106 is connected to a pressurized container 1103, and the cylinder and the container are filled with a refractive index adjusting liquid 1105. By actuating the cylinder 1106 by use of a piston driving motor 1108, the pressure of the refractive index adjusting liquid 1105 inside the pressurized container 1103 can be adjusted. Denoted at 1111 is a laser. Laser light from the laser is collimated by a collimator lens 1103, and parallel light provided thereby is directed to a glass window 1114. A stage 1100, on which a substrate 1102 is placed, is made movable in three-dimensional directions, for alignment of the substrate 1102 with an exposure mask that comprises a mask base material 1104 and a metal light-blocking film 1115. The surface of the substrate 1102 is coated with a resist 1109.

In this apparatus, for closely contacting the exposure mask to the resist surface 1109, pressure changing means for changing the pressure to the exposure mask through the operation of the piston 1107, for example, is used. In such pressure changing means, in order to assure gas-tightness, to thereby attain stable pressure, as an example, a lubricant material is applied to the piston sliding-motion portion. Such a lubricant material may become a source of volatile substances, or foreign substances, which may enter into the pressure container through the sliding-motion portion, to cause contamination of the rear surface of the exposure mask. If particles or such substances from the lubricant material are adhered to the exposure mask, it may cause degradation in the uniformity of the exposure light projected to the exposure mask pattern.

In order to remove such substances completely from the exposure mask surface, the apparatus may be shut down after completion of the entire exposure cycle, and then, the exposure mask may be unloaded from the exposure apparatus, and thereafter, the rear surface of the mask may be washed to remove the substances. Since such a cleaning operation has to be carried out by interrupting the continuous operation of an exposure process, the time that can be actually used for the exposure process may be decreased, which may, in turn, lead to a slower throughput.

SUMMARY OF THE INVENTION

It is accordingly an object of the present invention to provide a device and/or a method for controlling close contact of a near-field exposure mask by which, in close-contact exposure using that exposure mask, deposition of foreign substances to the exposure mask can be reduced, and the throughput can be improved.

It is another object of the present invention to provide a near-field exposure mask that can be suitably used with such a device or method described above.

In accordance with one aspect, the present invention provides a device for controlling close contact of a near-field exposure mask, the device comprising a pressure adjustable container for controllably closely contacting the near-field exposure mask to a substrate to be exposed, wherein the pressure adjustable container has a structure adapted to be tightly closed, with the exposure mask being held mounted, and wherein a pressure of the pressure adjustable container is adjustable through a change in capacity of the pressure adjustable container.

In accordance with another aspect, the present invention provides a near-field exposure mask to be used with a close contact controlling device for controllably closely contacting the near-field exposure mask to a substrate to be exposed, the device comprising a mask main body having a mask pattern formed thereon, a pressure propagating film provided at a back of the mask main body, and a pressure sealed space sandwiched by the mask main body and the pressure propagating film.

In accordance with a further aspect, the present invention provides a method of controlling close contact of a near-field exposure mask used with a pressure adjustable container for controllably closely contacting the near-field exposure mask to a substrate to be exposed. The method includes using a near-field exposure mask (as discussed above), as the near-field exposure mask, and changing an inside capacity of a pressure sealed space of the near-field exposure mask on the basis of a pressure of the pressure adjustable container, by use of a close contact controlling device (as discussed above), thereby to control the close contact of the near-field exposure mask.

Briefly, then, in accordance with the foregoing, the present invention can accomplish a device and/or a method of controlling close contact of a near-field exposure mask, or, alternatively, an exposure mask suitable therewith, by which, in close-contact exposure using that exposure mask, deposition of foreign substances to the exposure mask can be reduced and the throughput can be improved.

These and other objects, features and advantages of the present invention will become more apparent upon a consideration of the following description of the preferred embodiments of the present invention, taken in conjunction with the accompanying drawings.

DESCRIPTION OF THE PREFERRED EMBODIMENTS

Preferred embodiments of the present invention will now be described, with reference to the attached drawings.

In a near-field exposure mask close contact controlling mechanism according to one preferred form of the present invention, a pressure adjustable container for controllably closely contacting a near-field exposure mask to a substrate to be exposed has a structure adapted to be tightly closed with the exposure mask being held mounted, and the pressure of the pressure adjustable container is made adjustable through a change in capacity of the pressure adjustable container. This ensures prevention of particle deposition on the rear surface of the exposure mask.

In one preferred form of the present invention, a portion of the pressure adjustable container is made deformable or, alternatively, an auxiliary chamber having a deformable film structure is coupled to the pressure adjustable container, so that the pressure of the pressure adjustable container can be adjusted through a change in capacity thereof, due to the deformation of the deformable portion.

In one preferred form of the present invention, a near-field exposure mask has a mask main body having a mask pattern formed thereon, a pressure propagating film provided at a back of the mask main body, and a pressure sealed space sandwiched by the mask main body and the pressure propagating film. The inside capacity of the pressure sealed space of the mask can be changed on the basis of the pressure of a pressure adjustable container used with the mask, whereby close contact of the mask can be controlled.

A first embodiment of the present invention will now be described, with reference to an example wherein a portion of a pressure adjustable container is made deformable.

Figure 1:
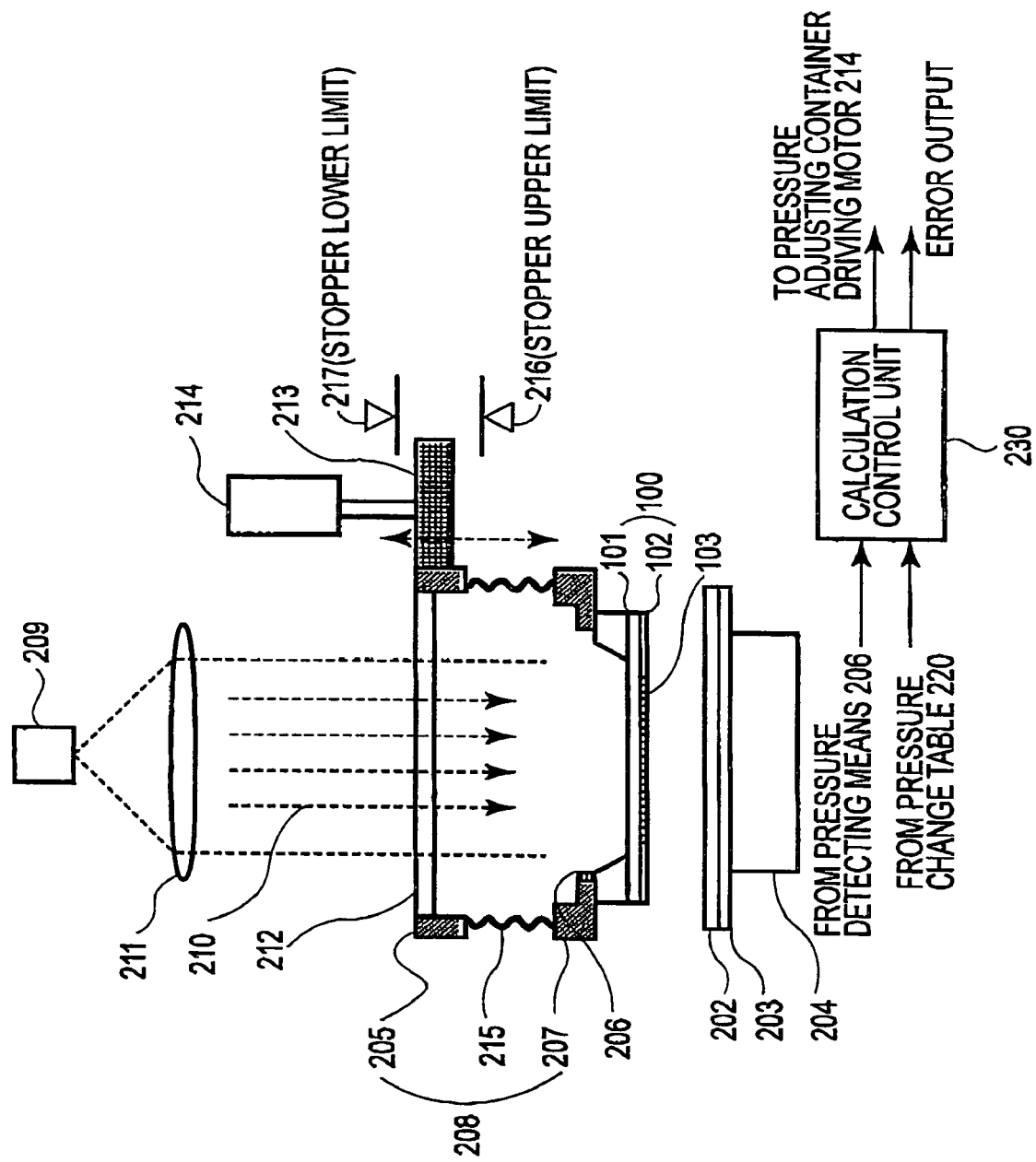
FIG. 1 is a schematic view of a general structure of a near-field exposure mask close-contact controlling mechanism according to an embodiment of the present invention, in which a portion of a pressure adjustable container is made deformable.

FIG. 1 is a schematic view of a general structure of a near-field exposure mask close contact controlling mechanism according to the first embodiment of the present invention, wherein a portion of a pressure adjustable container is made deformable.

Denoted in FIG. 1 at 100 is a mask, and denoted at 101 is a mask base material. Denoted at 102 is a metal thin film, and denoted at 103 is a small-opening pattern. Denoted at 202 is a resist, and denoted at 203 is a substrate. Denoted at 204 is a stage, and denoted at 205 is an upper pressure adjustable container. Denoted at 205 is pressure detecting means, and denoted at 207 is a lower pressure adjustable container. Denoted at 206 is a pressure adjustable container. Denoted at 209 is an exposure light source, and denoted at 210 is exposure light. Denoted at 211 is a collimator lens, and denoted at 212 is a glass window. Denoted at 213 is a driving arm, and denoted at 214 is a pressure adjustable container driving motor. Denoted at 215 is a movable structure (bellows). Denoted at 216 is an upper limit stopper, and denoted at 217 is a lower limit stopper. Denoted at 220 is a pressure change table, and denoted at 230 is an operational control unit. The pressure adjustable container 220, which is deformable, has a tightly closed structure that comprises the upper pressure adjustable container 205, the bellows 215, the lower pressure adjustable container 207, and the mask 100. The upper pressure adjustable container 205 is connected to the pressure adjustable container driving motor 214 through the driving arm 213. The movable range of the driving arm 213 is restricted by means of the upper and lower limit stoppers 216 and 217. The exposure mask 100 is elastically deformed in response to a pressure adjustable container driving motor 214, and close contact to, and separation from, the resist 202 is controlled thereby.

In accordance with this embodiment of the present invention, by the provision of the bellows 215, a portion of the pressure container is deformed, and the capacity of the pressure container is changed, such that the pressure adjustment can be done, while keeping the tightly closed structure. As a result, particle adhesion to the mask rear surface can be avoided assuredly.

A second embodiment of the present invention will be explained next, with reference to an example wherein an auxiliary chamber having a deformable film structure is coupled to a pressure adjustable container.

Figure 2:
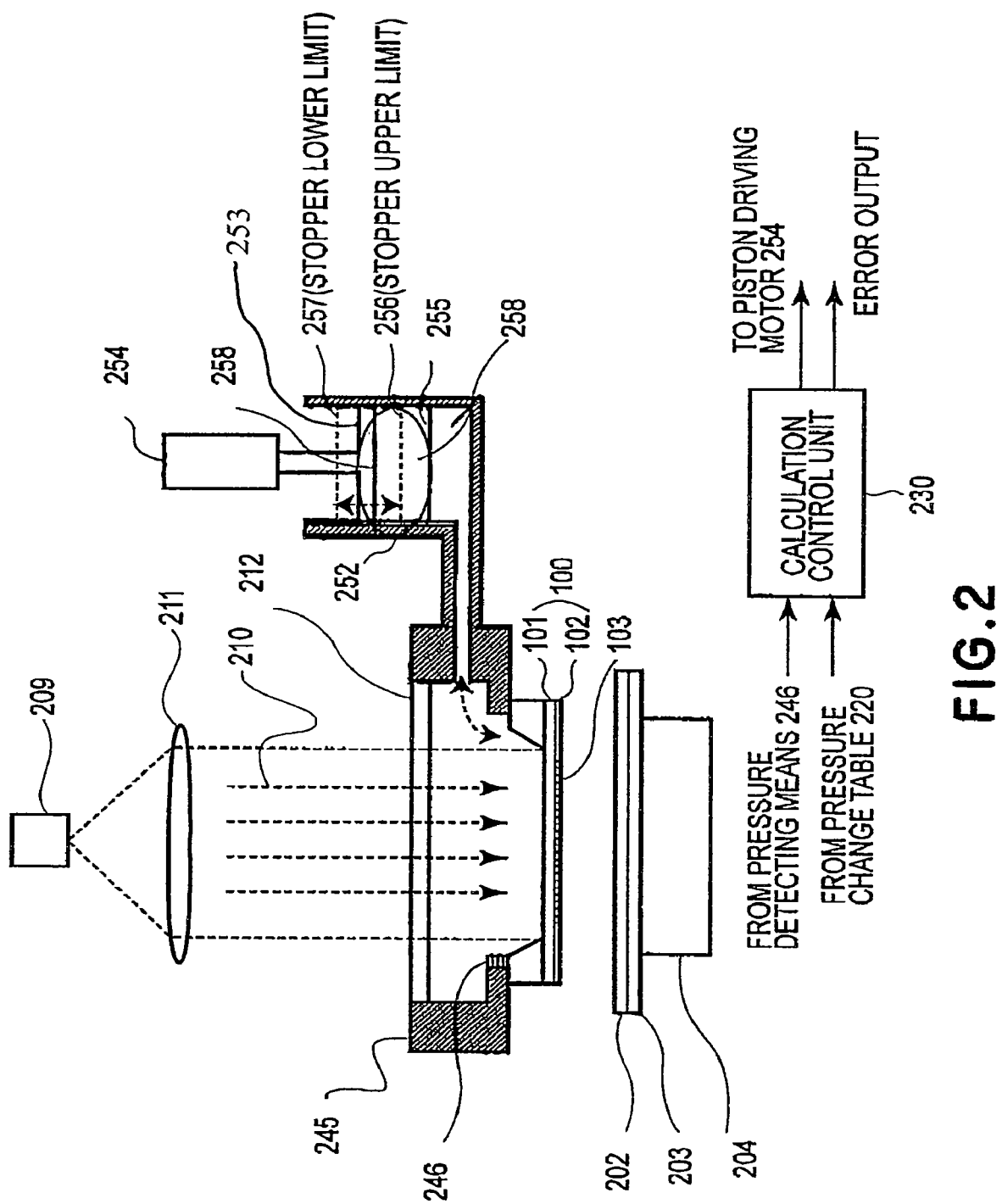
FIG. 2 is a schematic view of a general structure of a near-field exposure mask close-contact controlling mechanism according to another embodiment of the present invention, in which an auxiliary chamber has a deformable film structure.

FIG. 2 is a schematic view of a general structure of a near-field exposure mask close contact controlling mechanism according to the second embodiment of the present invention, wherein an auxiliary chamber having a deformable film structure is provided. The elements of this embodiment similar to those of the FIG. 1 embodiment are denoted by like numerals.

Denoted in FIG. 2 at 245 is a pressure adjustable container, and denoted at 246 is pressure detecting means. Denoted at 252 is a cylinder, and denoted at 253 is a piston. Denoted at 254 is a piston driving motor, and denoted at 255 is a pressure propagating thin film. Denoted at 256 is an upper limit stopper, and denoted at 257 is a lower limit stopper. Denoted at 258 is an auxiliary chamber.

In the pressure container structure with an auxiliary chamber shown in FIG. 2, the auxiliary chamber 258 is provided by the piston 253, the cylinder 252 and the pressure propagating thin film 255. The piston 253 is connected to the piston driving motor 254.

The movable range of the piston 253 is restricted by the upper and lower limit stoppers 256 and 257. The pressure propagating thin film 255 is elastically deformed in response to a change in capacity caused by movement of the piston 253, thereby to change the capacity of the pressure container. This capacity change, in turn, causes a change in pressure by which the mask 100 can be closely contacted to, or separated from, the resist 202.

In accordance with this embodiment of the present invention, although the auxiliary chamber 258 is connected to the pressure adjustable container 245, the inside of the pressure adjustable container 245 is completely held tightly-closed by means of the pressure propagating thin film 255 of the auxiliary chamber 258. Therefore, undesirable mixture of foreign substances, such as a lubricant material at the piston sliding-motion portion, into the pressure adjustable container 245, and resultant contamination of the rear surface of the exposure mask, can be prevented effectively. When the auxiliary chamber structure such as the one in this embodiment is used, pressure adjustment can be done by use of a simple adjusting mechanism having a piston.

Next, a third embodiment of the present invention will be explained with reference to an example of a near-field exposure mask having a pressure sealed space.

Figure 4A:
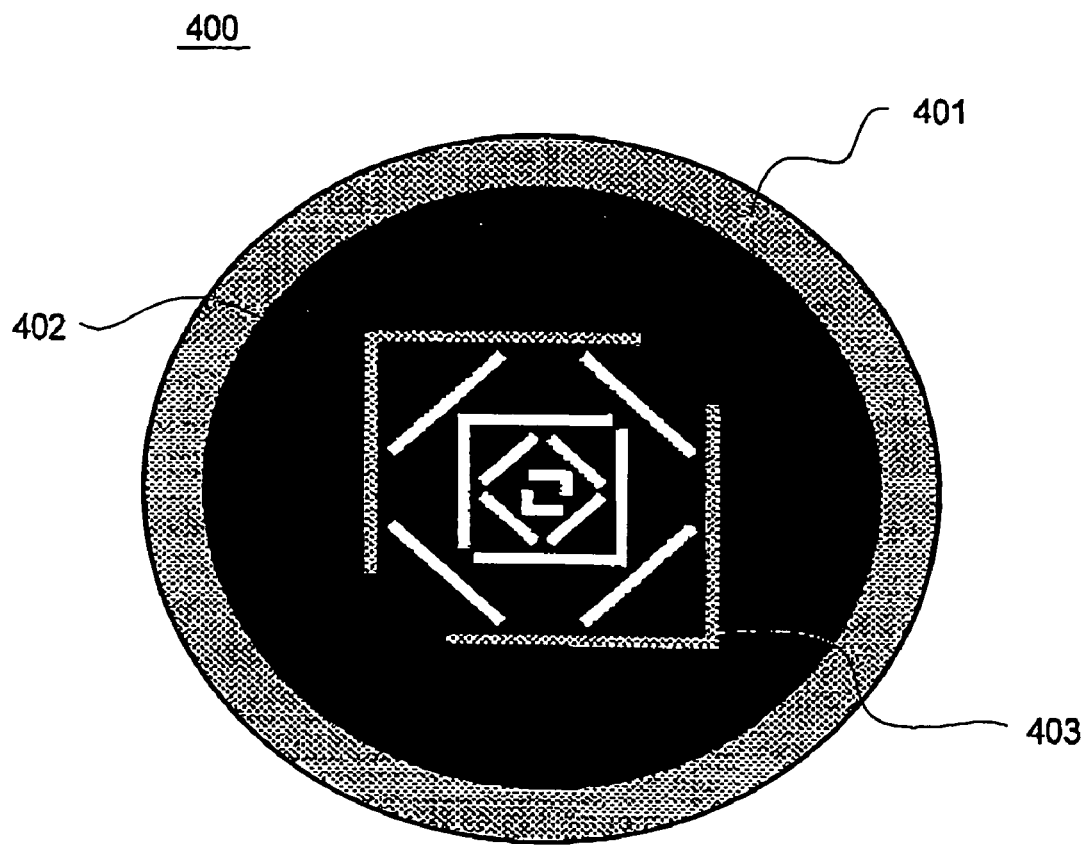
FIGS. 4A and 4B are a plan view and a sectional view, respectively, of an exposure mask having a pressure propagating film, according to another embodiment of the present invention.
Figure 4B:
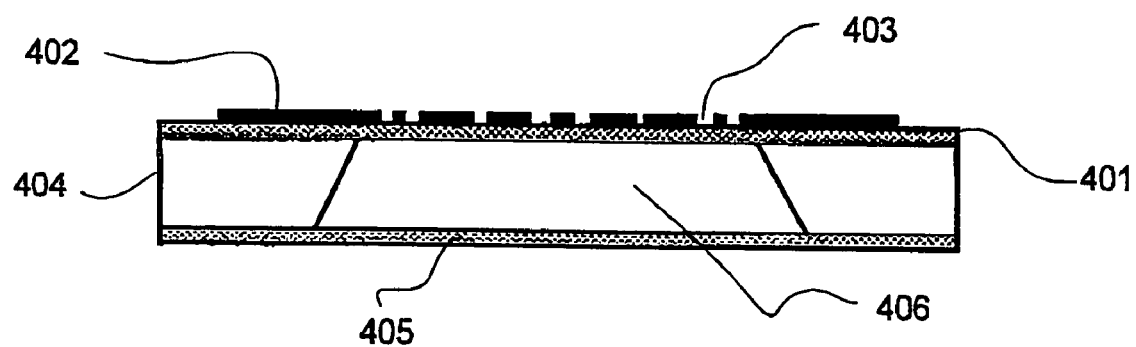
Figure 5:
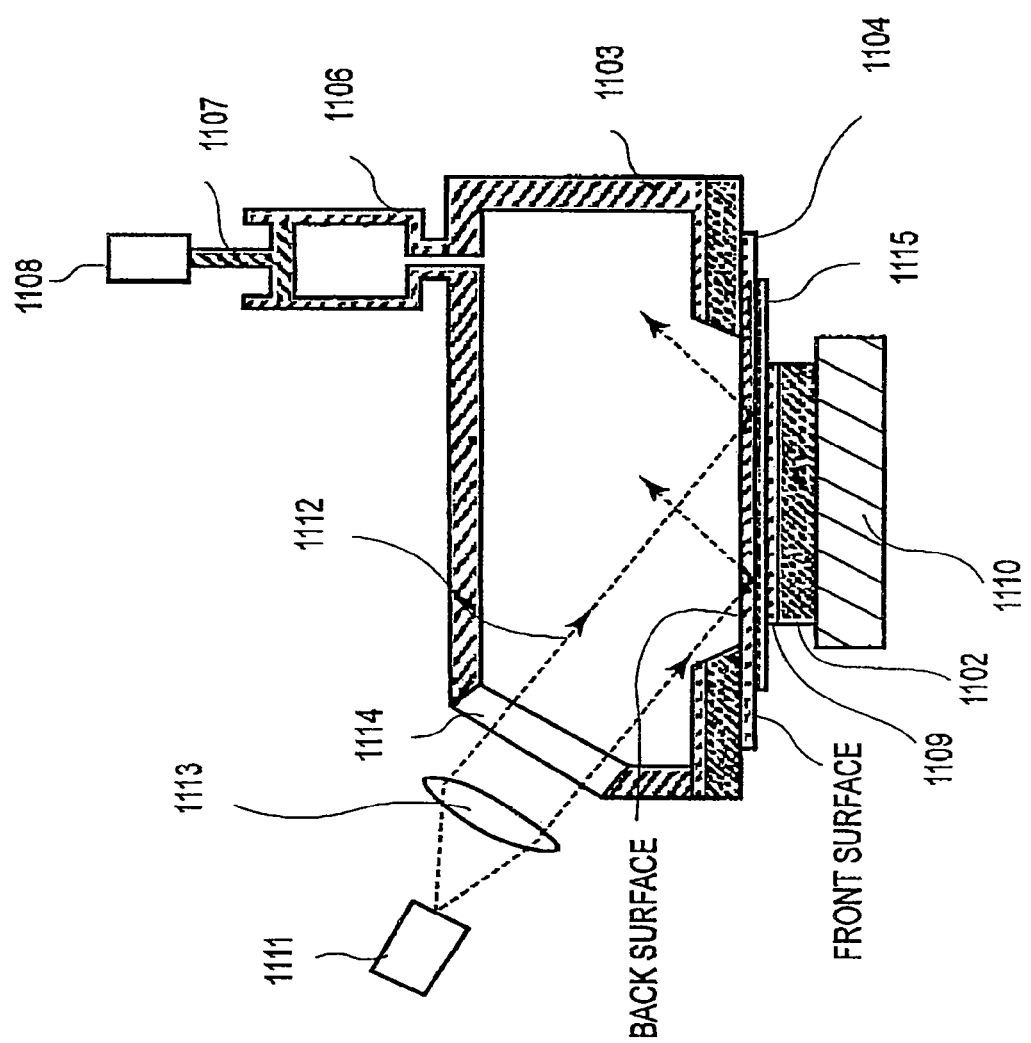
FIG. 5 is a schematic view of a structure of a near-field exposure mask close-contact controlling mechanism of a known type.

FIGS. 4A and 4B show a general structure of an exposure mask having a pressure propagating thin film, according to the third embodiment of the present invention.

Denoted at FIGS. 4A and 4B at 400 is an exposure mask, and denoted at 401 is a mask base material. Denoted at 402 is a metal thin film, and denoted at 403 is a small-opening pattern. Denoted at 404 is a mask supporting member, and denoted at 405 is a pressure propagating thin film. Denoted at 406 is a closed space.

A pressure sealed space is defined between the mask 401 and the pressure propagating thin film 405 provided at the rear side of the mask. In operation, the inside capacity of this pressure sealed space is changed by the pressure of the pressure adjustable container, so that the pressure inside the closed space 406 is raised thereby, and the exposure mask is flexed thereby, such that the mask can be closely contacted to the resist surface.

Another embodiment of the present invention will now be explained with reference to an example of a near-field exposure apparatus having a near-field mask close contact controlling mechanism according to the first embodiment discussed above.

The operation of this exposure apparatus will be explained in conjunction with FIG. 1.

As an object to be exposed, a resist 202 is applied to the surface of a substrate 203. The substrate 203 with the resist 202 is placed on the stage 204 and, by moving the stage 204, relative alignment of the substrate 203 with the exposure mask 100 with respect to two-dimensional directions along the mask surface is carried out.

Subsequently, the stage 204 is driven in a direction of a normal to the mask surface, so that the front surface of the exposure mask 100 and the resist surface 202 are closely contacted to each other throughout the entire surface, with a clearance therebetween becoming under 100 nm. After this, the exposure light 210, emitted from the exposure light source 209 and transformed into parallel light by the collimator lens 211, is introduced into the pressure adjustable container 208 through the glass window 212. The exposure light is projected on the exposure mask 100 from its rear surface side (upper surface side in FIG. 1), and the resist 202 is exposed with a near field that leaks from the small-opening pattern 103 formed in the metal thin film 102 upon the mask base material 101, which is at the front surface side of the exposure mask 100.

For close contact between the exposure mask and the resist 202 (substrate 203), the upper pressure adjustable container 205, connected to the driving arm 213, is moved downwardly through the actuation of the pressure adjustable container driving motor 214. In response, the movable structure 215 deforms, and the capacity of the pressure adjustable container 208 decreases, such that the pressure thereof increases. As a result of this pressure change, elastic deformation and resultant flexure are produced in the mask 100, whereby the thin film portion, as a whole, is closely contacted to the resist.

For separation of the mask 100, the driving arm 213 moves upwardly, to lift the upper pressure adjustable container 205 upwardly, thereby, to increase the capacity of the pressure adjustable container 208.

Here, the pressure detecting means 206 may detect a change in pressure, and it may be compared in the operation control unit 230 with data stored in the pressure change table 202. Based on this, the pressure adjustable container driving motor 214 may be controlled, to control the rate of pressure change to be applied to the mask 100, to thereby avoid excessive stress application to the mask 100. This is effective to prolong the lifetime of the mask. Simultaneously, correction of any insufficiency of the mask close contact, due to a slight pressure leakage at the chucking portion between the pressure adjustable container 208 and the mask 100, can be enabled.

For both close contact and separation, the range of capacity change is restricted by means of upper and lower limit stoppers, such that excessive pressure application to the mask can be prevented.

In accordance with this embodiment of the present invention, close contact control of the near-field exposure mask can be performed by use of a pressure adjustable container having a tightly closed structure. Thus, particle deposition on the exposure mask can be prevented assuredly, and any decrease of the yield due to a fault of the exposure pattern can be avoided or suppressed. Furthermore, since there is no necessity of unloading the exposure mask from the exposure apparatus for removal of foreign substances from the mask, the throughput can be improved significantly.

A further embodiment of the present invention will be explained below with reference to an example of a near-field exposure apparatus, in which an exposure mask having a pressure propagating thin film is applied to a close contact controlling mechanism.

Figure 3:
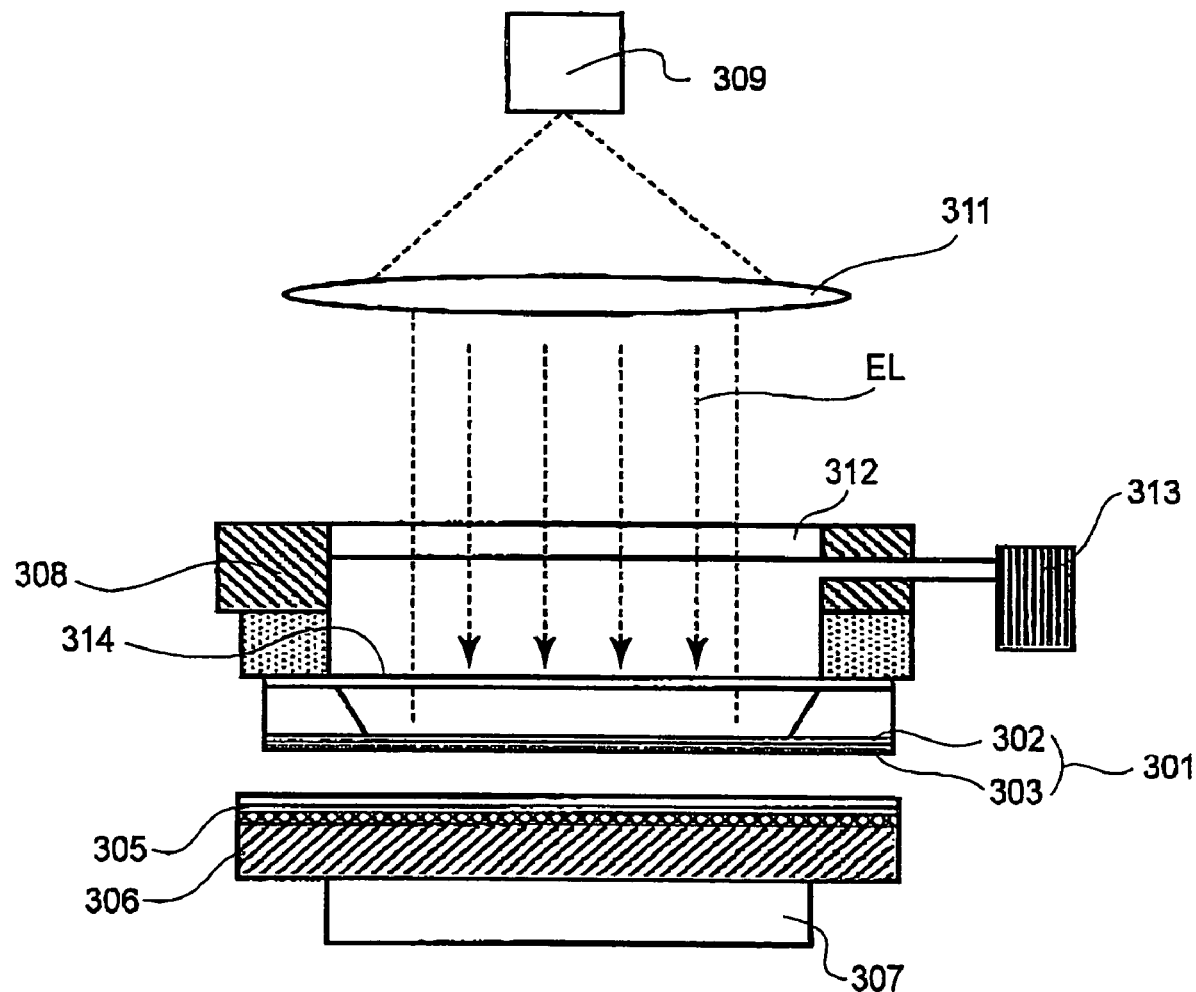
FIG. 3 is a schematic view of a general structure of a near-field exposure apparatus according to another embodiment of the present invention.

FIG. 3 is a schematic view of a general structure of a near-field exposure apparatus according to this embodiment. FIGS. 4A and 4B illustrate an exposure mask having a pressure propagating thin film, which can be used in the near-field exposure apparatus of this embodiment.

The operation of the exposure apparatus according to this embodiment will be explained in conjunction with FIG. 3.

As an object to be exposed, a resist 305 is applied to the surface of a substrate 306. The substrate 306 with the resist 305 is placed on a stage 307 and, by moving the stage 307, relative alignment of the substrate 306 with an exposure mask 301 with respect to two-dimensional directions along the mask surface is carried out.

Subsequently, the stage 307 is driven in a direction of a normal to the mask surface, so that the front surface of the exposure mask 301 and the resist surface 305 are approximated to each other and, in accordance with the close contacting method of this embodiment, they are closely contacted to each other throughout the entire surface, with a clearance therebetween becoming under 100 nm. After this, exposure light EL, emitted from an exposure light source 309 and transformed into parallel light by a collimator lens 311, is introduced into a pressure adjustable container 308 through a glass window 312. The exposure light is projected on the exposure mask 301 from its rear surface side (upper surface side in FIG. 3), and the resist 305 is exposed with a near field that leaks from a small-opening pattern formed in a metal thin film 303 upon the mask base material 302, which is at the front surface side of the exposure mask 301.

Referring now to FIGS. 4A and 4B, the manner in which the exposure mask is closely contacted to the resist surface in this embodiment will be explained in greater detail.

As shown in FIGS. 4A and 4B, a pressure propagating thin film 405 (at 314 in FIG. 3) is at the rear surface side of the exposure mask 400. With the provision of this pressure propagating thin film at the rear surface of the exposure mask 400, the space sandwiched between them can be closed (the space will be referred to as "pressure sealed space 406"). The exposure mask, having a pressure propagating thin film 405 of the structure, such as described above, is mounted to the pressure adjustable container 308, with the pressure propagating thin film 314 (405) thereof facing the container.

Subsequently, by using the pressure adjusting means 313, the inside pressure of the pressure adjustable container 308 is raised to a higher pressure as compared with the atmospheric pressure outside the pressure adjustable container. As the inside pressure of the pressure adjustable container is raised, the pressure propagating thin film 314 is flexed by that pressure to change the inside capacity of the pressure sealed space 406. As a result, the pressure inside the closed space 406, as well, is raised to cause flexure of the exposure mask, to bring it to closely contact the resist surface 305. Here, since the pressure propagating thin film is provided at the rear surface side of the exposure mask, contamination of the mask rear surface by external foreign particles during mask mounting or mask demounting can be prevented effectively.

The near-field exposure mask close contact controlling mechanism used as pressure adjusting means may be either one of those described with reference to the first and second embodiments, or it may be any other one known in the art, such as, for example, a mechanism for adjusting the pressure by introducing and discharging a gas from and to the outside, as described in the introductory part of this specification.

While the invention has been described with reference to the structures disclosed herein, it is not confined to the details set forth, and this application is intended to cover such modifications or changes as may come within the purposes of the improvements or the scope of the following claims.

What is claimed is:

1. A near-field exposure apparatus for exposing a substrate to light via an exposure mask under a condition that the exposure mask is close to the substrate, said apparatus comprising:

a pressure adjustable container configured to control a relative position of the exposure mask to the substrate by adjusting a pressure of said pressure adjustable container, wherein said pressure adjustable container has a structure adapted to be tightly closed with the exposure mask being held mounted, so as to prevent volatile substances or foreign substances from entering into said pressure adjustable container, wherein the pressure of said pressure adjustable container is adjustable through a change in capacity of said pressure adjustable container and wherein a portion of said pressure adjustable container is deformable so that the pressure of said pressure adjustable container is adjustable through a change in capacity thereof due to deformation of said pressure adjustable container.

2. An apparatus according to claim 1, wherein the deformable portion of said pressure adjustable container comprises a bellows.

3. An apparatus according to claim 1, wherein said pressure adjustable container has an auxiliary chamber coupled to said pressure adjustable container and has a deformable film structure for tightly separating said pressure adjustable container and said auxiliary chamber from each other, and wherein the pressure of said pressure adjustable container is adjustable through a change in capacity of said auxiliary chamber due to deformation of the deformable film structure.

4. An apparatus according to claim 3, further comprising pressuring means, having a piston mechanism, for causing the change in capacity of said auxiliary chamber.

5. An apparatus according to claim 1, further comprising a limiting member for limiting the amount of change in capacity of said pressure adjustable container.

6. An apparatus according to claim 1, further comprising pressure detecting means for detecting a change in pressure of said pressure adjustable container due to a change in capacity, and a control system for comparing the pressure detected by said pressure detecting means and data stored in a pressure change table to control the pressure.

7. An apparatus according to claim 1, further comprising a limiting member for limiting the amount of change in capacity of said pressure adjustable container.

8. An apparatus according to claim 2, further comprising a limiting member for limiting the amount of change in capacity of said pressure adjustable container.

9. An apparatus according to claim 3, further comprising a limiting member for limiting the amount of change in capacity of said pressure adjustable container.

10. An apparatus according to claim 4, further comprising a limiting member for limiting the amount of change in capacity of said pressure adjustable container.

* * * * *